(12) United States Patent
Samson et al.

(10) Patent No.: US 10,539,997 B2
(45) Date of Patent: Jan. 21, 2020

(54) ULTRA-LOW-POWER DESIGN MEMORY POWER REDUCTION SCHEME

(71) Applicant: QUALCOMM Incorporated, San Diego, CA (US)

(72) Inventors: Giby Samson, San Diego, CA (US); Parixit Laljibhai Aghera, San Diego, CA (US); Adam Edward Newham, Poway, CA (US)

(73) Assignee: QUALCOMM Incorporated, San Diego, CA (US)

( * ) Notice: Subject to any disclaimer, the term of this patent is extended or adjusted under 35 U.S.C. 154(b) by 165 days.

(21) Appl. No.: 15/255,176

(22) Filed: Sep. 2, 2016

(65) Prior Publication Data

US 2018/0067539 A1    Mar. 8, 2018

(51) Int. Cl.
*G06F 1/32* (2019.01)
*G06F 1/3287* (2019.01)
*G06F 1/3296* (2019.01)

(52) U.S. Cl.
CPC .......... *G06F 1/3287* (2013.01); *G06F 1/3296* (2013.01)

(58) Field of Classification Search
CPC .......... G06F 12/00; G06F 1/32; G06F 1/3287; G06F 1/3296; G06F 1/26; G06F 1/266; Y02B 60/1225
See application file for complete search history.

(56) References Cited

U.S. PATENT DOCUMENTS

| 7,930,565 | B2 | 4/2011 | Saewong et al. |
| 8,127,167 | B2 | 2/2012 | Wang et al. |
| 8,478,932 | B2 | 7/2013 | Baek et al. |
| 9,001,608 | B1* | 4/2015 | Chishti ............ G11C 11/40611 365/149 |
| 2003/0145239 | A1 | 7/2003 | Kever et al. |
| 2007/0043965 | A1 | 2/2007 | Mandelblat et al. |
| 2013/0138876 | A1* | 5/2013 | Wang .................... G06F 12/123 711/104 |

(Continued)

OTHER PUBLICATIONS

International Search Report and Written Opinion—PCT/US2017/045501—ISA/EPO—dated Nov. 8, 2017.

(Continued)

*Primary Examiner* — Fahmida Rahman
(74) *Attorney, Agent, or Firm* — Muncy, Geissler, Olds & Lowe, P.C./QUALCOMM

(57) ABSTRACT

The disclosure generally relates to a memory power reduction scheme that can flexibly transition memory blocks among different power states to reduce power consumption (especially with respect to leakage power) in a manner that balances tradeoffs between reduced power consumption and performance impacts. For example, according to various aspects, individual memory blocks may be associated with an access-dependent age, whereby memory blocks that are not accessed may be periodically aged. As such, in response to the age associated with a memory block crossing an appropriate threshold, the memory block may be transitioned to a power state that generally consumes less leakage power and has a larger performance penalty. Furthermore, one or more performance-related criteria may be defined with certain memory blocks to prevent and/or automatically trigger a transition to another power state.

30 Claims, 8 Drawing Sheets

(56) References Cited

U.S. PATENT DOCUMENTS

2013/0308409 A1 11/2013 Priel et al.
2013/0326252 A1* 12/2013 Ise .................. G06F 1/3234
 713/323
2015/0277541 A1 10/2015 Jain et al.
2016/0124490 A1 5/2016 Kupermann et al.

OTHER PUBLICATIONS

Flautner K., et al., "Drowsy Caches: Simple Techniques for Reducing Leakage Power", Proceedings. 29th Annual International Symposium on Computer Architecture, May 2002, 10 pages.

* cited by examiner

ULTRA-LOW-POWER DESIGN MEMORY POWER REDUCTION SCHEME

TECHNICAL FIELD

The various aspects and embodiments described herein generally relate to managing power consumption in an on-die memory circuit, and more particularly, to a memory power reduction scheme that can flexibly transitions between different memory power states to achieve low overall power and reduced access time penalties.

BACKGROUND

Integrated circuit fabrication technology continually improves, and consequently, transistors continue to shrink in size. As such, more transistors and more complicated circuits can be fabricated on an integrated circuit die, or alternatively, on a smaller die to be used in a given circuit. Smaller transistor size also supports faster operating speeds and provides other benefits. For on-die memories (e.g., dynamic random access memory (DRAM)), a major issue with shrinking transistor size is standby power, as smaller transistor geometry results in higher electric fields, which stresses a transistor and causes oxide breakdown. Furthermore, on-die memory circuits are typically subject to leakage that could cause stored information to be discharged unless the memory circuits are periodically refreshed, which can increase the power that on-die memory circuits consume. Accordingly, a lower power supply voltage is often used for smaller geometry transistors to decrease the electric field. However, the lower power supply voltage also increases the delay of the transistors, which undesirable for high-speed circuits. To reduce the delay and improve operating speed, one approach is to reduce the threshold voltage ($V_t$) at which the transistors turn on. However, the lower threshold voltage and smaller transistor geometry result in higher leakage current, which is the current passing through a transistor when it is turned off. As such, because on-die memories typically occupy a large portion of area and contribute towards overall chip-leakage power, memory leakage power is often a significant fraction of wasted power, which can be especially problematic for wearable devices, health monitors, low-power sensors, cellular phones, and other devices where battery life is extremely important.

Furthermore, many modern mobile devices have substantial bandwidth and performance demands, which can exacerbate problems that relate to high power consumption. In particular, although the power that memory circuits consume can differ depending on the power mode or state associated with the memory circuits, the power mode or state can increase memory access latency and otherwise impact overall system performance. For example, a "power-down" state may use the least power and result in minimal to no leakage power. However, the "power-down" state shuts the memory circuits off such that the memory circuits cannot be accessed. On the other hand, in an "operational" state, the memory circuits consume more power and consequently contribute more towards overall leakage power, although in the "operational" state the memory circuits are accessible and ready to respond to memory access requests. Furthermore, transitioning between different power states or otherwise moving memory blocks between different power states tends to require power and time, which can increase memory access latency and compromise performance, especially in the event that memory power state transitions are frequent.

SUMMARY

The following presents a simplified summary relating to one or more aspects and/or embodiments disclosed herein. As such, the following summary should not be considered an extensive overview relating to all contemplated aspects and/or embodiments, nor should the following summary be regarded to identify key or critical elements relating to all contemplated aspects and/or embodiments or to delineate the scope associated with any particular aspect and/or embodiment. Accordingly, the following summary has the sole purpose to present certain concepts relating to one or more aspects and/or embodiments relating to the mechanisms disclosed herein in a simplified form to precede the detailed description presented below.

According to various aspects, a memory power reduction scheme as described herein may generally manipulate power states associated with individual memory blocks without having a substantial impact on performance. For example, to reduce leakage power, one or more memory blocks that are not accessed may be maintained in a retention state and/or another suitable low-leakage power state and only activated or otherwise moved to higher-leakage states when accessed. Furthermore, because moving memory blocks into the low-leakage states and back to the active power state can take time (and power), which can increase memory access latency, lower overall system performance, and increase power consumption if state transitions are very frequent, the memory power reduction scheme described herein may have the flexibility to optimize memory state transitions to achieve low overall power and reduce access time penalties.

For example, according to various aspects, one or more memory blocks may initially hold active data. In response to an implementation-dependent memory power monitor trigger, one or more memory blocks may be moved between an "active" power state and a "retention" power state or another suitable low-leakage state based on the monitor state. Accordingly, in response to determining that a memory block in a low-leakage state is accessed, a hardware mechanism may automatically transition the memory block to the "active" state with minimal delay and complete the memory transaction once a power rail used to supply power to the memory block has stabilized. Furthermore, each memory block in the "active" state that is not accessed may be periodically aged in an implementation-dependent manner and transitioned to the retention state or another suitable low-leakage state in response to the memory block age reaching a threshold. However, in various embodiments, certain memory blocks may be pinned to the active state to ensure that such memory blocks remain available and/or define other suitable performance-related criteria with respect to certain memory blocks to prevent and/or automatically trigger power state transitions regardless of the age associated with such memory blocks. Furthermore, according to various aspects as will be described in further detail herein, mechanisms to control, update, and track the power state associated with each memory block can be implemented in hardware, software, or any suitable combination thereof.

According to various aspects, the memory power reduction scheme described herein may be used to move memory blocks between different power states that be subject to different leakage powers depending on access histories and/or other suitable criteria. For example, in various embodiments, a memory block in an active state may stay in the active state if the memory block is accessed, or the memory block may be transitioned to an intermediate low-leakage state in response to the age associated therewith reaching a first threshold based on the memory block not being accessed over time. Furthermore, the memory block may be transitioned to a retention state with even less leakage power in response to the age associated therewith reaching a second threshold that may be larger than the first threshold, or to a "power-down" state with substantially no leakage power in response to the age associated therewith reaching a third threshold larger than both the first and second thresholds. In general, the various power states and transition control signals may depend on certain implementation-specific details, although the "retention" power state as described herein contemplates a power state that operates at the lowest possible voltage required to retain the state associated with the memory block, while the "power-down" state as described herein contemplates a power state in which the memory state is lost. Alternatively and/or additionally, transitions among the various power states may be effected through a control signal in conjunction with and/or independently from any mechanisms used to control the operational voltage(s). Furthermore, the threshold to trigger a transition to the power-down state may be defined in a conservative manner to prevent memory blocks from transitioning to the power-down state while data stored therein may still be needed. Accordingly, in addition to pinning certain memory blocks to the active state to ensure that such memory blocks can be accessed without any wake-up penalty, the memory power reduction scheme described herein may further block certain memory blocks from transitioning to the power-down state to prevent losing the memory state associated therewith. Furthermore, in various embodiments, any memory blocks in the retention state and/or the other intermediate state(s) may be transitioned to lower-leakage states, as applicable, when the age associated therewith reaches the appropriate threshold values, and memory blocks in a low-leakage state may be moved to the active state once the memory blocks are accessed. In a related context, one or more memory blocks may be automatically transitioned to the power-down state in response to an appropriate signal indicating that the data stored in such memory blocks is no longer being used. According to various aspects, more than one supply rail may be used to realize the memory power reduction scheme described herein, whereby power may be delivered to the memory blocks in the various power states from an on-die power supply module, an external (off-chip) power supply module, and/or combinations thereof.

According to various aspects, a method for managing memory power consumption may therefore comprise increasing an age associated with a memory block operating in an active power state in response to determining that the memory block was not accessed in a current monitoring interval, determining whether the age associated with the memory block has crossed a threshold that triggers a transition to a low-leakage power state, and transitioning the memory block from the active power state to the low-leakage power state in response to the age associated with the memory block crossing the threshold that triggers the transition to the low-leakage power state and one or more performance-related criteria associated with the memory block permitting the transition to the low-leakage power state, wherein data stored in the memory block is retained in the low-leakage power state. In various embodiments, transitioning the memory block to the low-leakage power state may cause the memory block to consume less leakage power and have a greater access latency relative to the active power state (e.g., the low-leakage power state may be an intermediate low-leakage power state in which the memory block consumes more leakage power and has a lower access latency relative to a retention power state, a retention power state in which the memory block consumes the least power needed to retain the data stored in the memory block, etc.).

According to various aspects, the method may alternatively and/or additionally comprise maintaining the memory block in the active power state in response to the one or more performance-related criteria associated with the memory block pinning the memory block to the active power state regardless of whether the age associated with the memory block has crossed the threshold that triggers the transition to the low-leakage power state. Furthermore, in various embodiments, the method may comprise transitioning the memory block to a power-down state in response to the one or more performance-related criteria associated with the memory block indicating that the data stored in the memory block does not need to be retained and/or when the age associated with the memory block crosses a threshold that triggers a transition to the power-down state and the one or more performance-related criteria associated with the memory block do not prevent the transition to the power-down state, wherein transitioning the memory block to the power-down state causes the memory block to consume substantially no leakage power. Furthermore, in response to receiving a request to access the memory block subsequent to transitioning the memory block to the low-leakage power state, the method may comprise activating one or more power rails used to deliver power to the memory block in the active power state to thereby transition the memory block from the low-leakage power state to the active power state and servicing the request to access the memory block in response to the one or more activated power rails have stabilized.

According to various aspects, an apparatus may comprise a memory system comprising multiple memory blocks and one or more circuits configured to operate at least one of the multiple memory blocks in an active power state, increase an age associated with the at least one multiple memory block in response to the at least one memory block not being accessed in a current monitoring interval, determine whether the age associated with the at least one memory block has crossed a threshold that triggers a transition to a low-leakage power state, and transition the at least one memory block from the active power state to the low-leakage power state in response to the age associated with the at least one memory block crossing the threshold that triggers the transition to the low-leakage power state and one or more performance-related criteria associated with the at least one memory block permitting the transition to the low-leakage power state, wherein data stored in the at least one memory block is retained in the low-leakage power state.

According to various aspects, an apparatus may comprise means for increasing an age associated with a memory block operating in an active power state in response to the memory block not being accessed in a current monitoring interval, means for determining whether the age associated with the memory block has crossed a threshold that triggers a transition to a low-leakage power state, and means for transitioning the memory block to the low-leakage power state in response to the age associated with the memory block crossing the threshold that triggers the transition to the low-leakage power state and one or more performance-related criteria associated with the memory block permitting the transition to the low-leakage power state, wherein data stored in the memory block is retained in the low-leakage power state.

According to various aspects, a computer-readable medium may store computer-executable instructions configured to cause one or more circuits to increase an age associated with a memory block operating in an active power state in response to the memory block not being accessed in a current monitoring interval, determine whether the age associated with the memory block has crossed a threshold that triggers a transition to a low-leakage power state, and transition the memory block from the active power state to the low-leakage power state in response to the age associated with the memory block crossing the threshold that triggers the transition to the low-leakage power state and one or more performance-related criteria associated with the memory block permitting the transition to the low-leakage power state, wherein data stored in the memory block is retained in the low-leakage power state.

Other objects and advantages associated with the aspects and embodiments disclosed herein will be apparent to those skilled in the art based on the accompanying drawings and detailed description.

BRIEF DESCRIPTION OF THE DRAWINGS

A more complete appreciation of the various aspects and embodiments described herein and many attendant advantages thereof will be readily obtained as the same becomes better understood by reference to the following detailed description when considered in connection with the accompanying drawings which are presented solely for illustration and not limitation, and in which.

DETAILED DESCRIPTION

Figure 1:
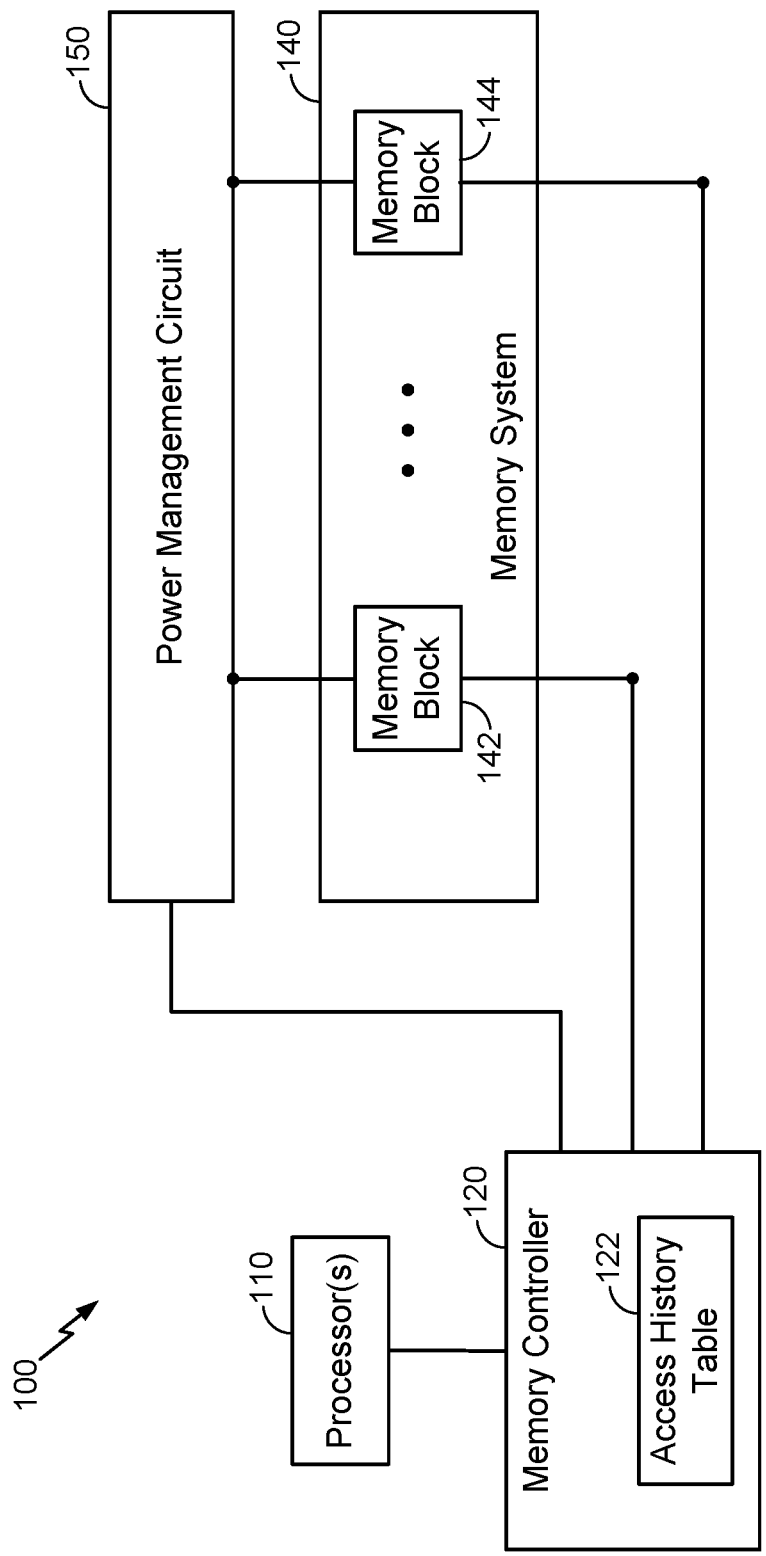
FIG. 1 illustrates an example architecture that can be used to manage memory circuit power consumption, according to various aspects.

Various aspects and embodiments are disclosed in the following description and related drawings to show specific examples relating to exemplary aspects and embodiments. Alternate aspects and embodiments will be apparent to those skilled in the pertinent art upon reading this disclosure, and may be constructed and practiced without departing from the scope or spirit of the disclosure. Additionally, well-known elements will not be described in detail or may be omitted so as to not obscure the relevant details of the aspects and embodiments disclosed herein.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation.

The terminology used herein describes particular embodiments only and should not be construed to limit any embodiments disclosed herein. As used herein, the singular forms "a," "an," and "the" are intended to include the plural forms as well, unless the context clearly indicates otherwise. Those skilled in the art will further understand that the terms "comprises," "comprising," "includes," and/or "including," as used herein, specify the presence of stated features, integers, steps, operations, elements, and/or components, but do not preclude the presence or addition of one or more other features, integers, steps, operations, elements, components, and/or groups thereof.

Further, various aspects and/or embodiments may be described in terms of sequences of actions to be performed by, for example, elements of a computing device. Those skilled in the art will recognize that various actions described herein can be performed by specific circuits (e.g., an application specific integrated circuit (ASIC)), by program instructions being executed by one or more processors, or by a combination of both. Additionally, these sequence of actions described herein can be considered to be embodied entirely within any form of non-transitory computer readable medium having stored thereon a corresponding set of computer instructions that upon execution would cause an associated processor to perform the functionality described herein. Thus, the various aspects described herein may be embodied in a number of different forms, all of which have been contemplated to be within the scope of the claimed subject matter. In addition, for each of the aspects described herein, the corresponding form of any such aspects may be described herein as, for example, "logic configured to" and/or other structural components configured to perform the described action.

According to various aspects, a memory power reduction scheme as described herein may address the above-mentioned problems associated with memory leakage power, wherein the memory power reduction scheme described herein may generally manipulate memory power states without having a substantial impact on performance. For example, to reduce leakage power, one or more memory blocks that are not accessed may be maintained in a retention state and/or another suitable low-leakage power state and only activated or otherwise moved to higher-leakage states when accessed. Furthermore, because moving memory blocks into the low-leakage states and back to the active power state can take time (and power), which can increase memory access latency, lower overall system performance, and increase power consumption if state transitions are very frequent, the memory power reduction scheme described herein may have the flexibility to optimize memory state transitions to achieve low overall power and reduce access time penalties.

For example, according to various aspects, in the memory power reduction scheme described herein, one or more memory blocks may initially hold active data. In response to a memory power monitor trigger, which can be implementation-dependent, memory blocks may be moved between an "active" power state and a "retention" power state or another suitable low-leakage state based on the monitor state. Accordingly, in response to determining that a memory block in a low-leakage state is accessed, a hardware mechanism may automatically transition the memory block to the "active" state with minimal delay and complete the memory transaction once a power rail used to supply power to the memory block has stabilized. Furthermore, each memory block in the "active" state that is not accessed may be periodically aged in an implementation-dependent manner and transitioned to the retention state or another suitable low-leakage state in response to the memory block age reaching a threshold. However, in various embodiments, the memory power reduction scheme may pin certain memory blocks (e.g., important operating system blocks) to the active state to ensure that such memory blocks remain available and/or define other suitable performance-related criteria with respect to certain memory blocks to prevent and/or automatically trigger power state transitions regardless of the age associated with such memory blocks. Furthermore, according to various aspects as will be described in further detail herein, mechanisms to control, update, and track the power state associated with each memory block can be implemented in hardware, software, or any suitable combination thereof.

According to various aspects, the memory power reduction scheme described herein may be used to move memory blocks between different power states that be subject to different leakage powers depending on access histories and/or other suitable criteria. For example, in various embodiments, a memory block in an active state may stay in the active state if the memory block is accessed, or the memory block may be transitioned to an intermediate low-leakage state in response to the age associated therewith reaching a first threshold based on the memory block not being accessed over time. Furthermore, the memory block may be transitioned to a retention state with even less leakage power in response to the age associated therewith reaching a second threshold that may be larger than the first threshold, or to a "power-down" state with substantially no leakage power in response to the age associated therewith reaching a third threshold larger than both the first and second thresholds. In general, the various power states and transition control signals may depend on certain implementation-specific details, although the "retention" power state as described herein contemplates a power state that operates at the lowest possible voltage required to retain the state associated with the memory block, while the "power-down" state as described herein contemplates a power state in which the memory state is lost. Alternatively and/or additionally, transitions among the various power states may be effected through a control signal in conjunction with and/or independently from any mechanisms used to control the operational voltage(s). Furthermore, the threshold to trigger a transition to the power-down state may be defined in a conservative manner to prevent memory blocks from transitioning to the power-down state while data stored therein may still be needed. Accordingly, in addition to pinning certain memory blocks to the active state to ensure that such memory blocks can be accessed without any wake-up penalty, the memory power reduction scheme described herein may further block certain memory blocks from transitioning to the power-down state to prevent losing the memory state associated therewith. Furthermore, in various embodiments, any memory blocks in the retention state and/or the other intermediate state(s) may be transitioned to lower-leakage states, as applicable, when the age associated therewith reaches the appropriate threshold values, and memory blocks in a low-leakage state may be moved to the active state once the memory blocks are accessed. In a related context, one or more memory blocks may be automatically transitioned to the power-down state in response to an appropriate signal indicating that the data stored in such memory blocks is no longer being used (e.g., an application may provide a signal to indicate that a certain task has been cleared from an execution stack whereby any memory blocks that store data associated with the cleared task can be transitioned to the power-down state because such data is no longer needed). According to various aspects, more than one supply rail may be used to realize the memory power reduction scheme described herein, whereby power may be delivered to the memory blocks in the various power states from an on-die power supply module, an external (off-chip) power supply module, and/or combinations thereof.

According to various aspects, FIG. 1 illustrates an example architecture 100 that can implement the memory power reduction scheme described herein. More particularly, in the example architecture shown in FIG. 1, a memory controller 120 may be coupled to at least one processor 110 and to a memory system 140 that includes various memory blocks 142, 144. In general, the memory system 140 may comprise a main memory with one or more memory circuits (not explicitly shown) configured to store data (e.g., dynamic random access memory), although those skilled in the art will appreciate that the memory system 140 may have other suitable configurations. In various embodiments, the memory controller 120 may provide an interface between the processor 110 and the memory system 140. However, those skilled in the art will further appreciate that other interfaces may be used to couple the processor 110 and the memory system 140 (e.g., a memory crossbar, system bus, and/or other suitable interconnect). According to various embodiments, the processor 110 may generally send one or more requests to access the memory system 140 to the memory controller 120, wherein the memory controller 120 may then to read data from and/or write data to the appropriate memory block(s) 142, 144 associated with the requests to complete a memory transaction and thereby fulfill the requests. The memory controller 120 may then send any necessary response back to the processor 110.

Among other things, power consumption and access time latencies (or more simply "performance") are important parameters in a digital system, such as a digital system having the architecture 100 shown in FIG. 1. Power consumption may be especially important in mobile or other battery-powered electronic devices where power consumption can directly affect the time that the device can be powered on a battery charge. Furthermore, the speed at which memory requests are fulfilled can have a significant impact on the overall speed in a digital system. Accordingly, maximizing memory throughput or bandwidth to reduce access time latencies and improve overall system performance may be desirable. However, referring to the example architecture 100 shown in FIG. 1, operating all memory blocks 142, 144 in the memory system 140 at a maximum speed (or lowest latency) can result in substantial leakage power and substantially impact overall power consumption. On the other hand, when lower voltages are supplied to the memory system 140, less leakage power may be consumed and overall power consumption may be reduced accordingly, although lowering the voltage supplied to the memory system 140 may carry a tradeoff in that bandwidth would decrease and access time latencies would increase (e.g., data would be read from and/or written to the memory blocks 142, 144 at a slower rate).

Accordingly, in various embodiments, a memory power reduction scheme as described herein may flexibly transition the various memory blocks 142, 144 in the memory system 140 between different power states such that the leakage power that each memory block 142, 144 consumes may be tuned or otherwise optimized based, at least in part, on an access-dependent age associated therewith. For example, in various embodiments, a "power-down" state may consume substantially no leakage power, although any memory blocks 142, 144 in the power-down state would be inaccessible and lose a state associated therewith. Furthermore, causing the memory blocks 142, 144 to enter and exit the power-down state may carry a performance penalty with respect to time and power. In contrast, any memory blocks 142, 144 in an "active" state may be ready to process memory requests with substantially no access time penalty, although memory blocks 142, 144 in the active state may contribute the most leakage power.

Accordingly, in the memory power reduction scheme described herein, the memory blocks 142, 144 may be configured to operate in one or more low-leakage power states between the active state and the power-down state. For example, in various embodiments, the one or more low-leakage power states may include at least a retention state, wherein memory blocks 142, 144 in the retention state may be operated at the lowest voltage at which the memory blocks 142, 144 can retain a state associated therewith. Additionally, in various embodiments, the low-leakage power states may further include an intermediate power state, wherein memory blocks 142, 144 in the intermediate power state may operate at a voltage between the voltages used in the active and retention states. As such, the intermediate power state may consume less leakage power than the active state and more leakage power than the retention state, while offering a performance advantage relative to the retention state due to having a lower wake-up penalty. Accordingly, in various embodiments, the memory power reduction scheme described herein may include at least four power states in which the memory blocks 142, 144 can be operated, which may include (1) an active power state, (2) an intermediate low-leakage state, (3) a retention state, and (4) a power-down state, wherein the active power state may have the highest leakage power and no wake-up penalty, while the intermediate low-leakage state may offer a moderate reduction in leakage power and a low wake-up penalty relative to the active state. Furthermore, the retention state may consume less leakage power than the intermediate state and offer a substantial reduction in leakage power relative to the active state, although the retention state may have a greater wake-up penalty than the intermediate power state. Further still, the power-down state may consume substantially no leakage power with tradeoffs in that the power-down state has the longest wake-up penalty and any data stored in memory blocks 142, 144 that are transitioned to the power-down state will be lost. Those skilled in the art will also appreciate that the memory power reduction scheme can employ more or fewer low-leakage power states in various implementations.

According to various embodiments, to implement the memory power reduction scheme, the example architecture 100 shown in FIG. 1 may include a power management circuit 150 configured to control the power used to operate the various memory blocks 142, 144 in the memory system 140 and thereby transition the memory blocks 142, 144 between different power states based, at least in part, on an access-dependent age associated with each memory block 142, 144, etc. For example, in implementations where the memory power reduction scheme employs the four power states mentioned above, the power management circuit 150 may be configured to power memory blocks 142, 144 in the active state at a highest voltage, power memory blocks 142, 144 in the retention state at a lowest voltage at which the memory blocks 142, 144 can retain a state associated therewith, power memory blocks 142, 144 in the intermediate low-leakage state at an intermediate voltage falling between the voltages used to power memory blocks 142, 144 in the active and retention states, and supply a lowest voltage (or no voltage) to memory blocks 142, 144 in the power-down state. Alternatively and/or in conjunction with adjusting the voltage used to operate the memory blocks 142, 144, one or more control signals may be used to transition the memory blocks 142, 144 among the different power states. Furthermore, those skilled in the art will appreciate that although FIG. 1 shows the power management circuit 150 as a separate component, such depiction is for illustration purposes only and not limitation, whereby the power management circuit 150 may be suitably integrated into the memory controller 120, the processor 110, the memory system 140, and/or another suitable component, or alternatively provided as a separate component (e.g., a system on chip (SoC) or another suitable integrated circuit).

According to various embodiments, the power management circuit 150 may be coupled to and/or integrated with the memory controller 120, wherein the memory controller 120 may provide the power management circuit 150 with information (e.g., control signals) to control the power state in which the various memory blocks 142, 144 are operated according to an access-dependent age associated with the memory blocks 142, 144. For example, in various embodiments, the memory controller 120 may be configured to maintain an access history table 122 to track requests to access the memory system 140, wherein the access history table 122 may include one entry that corresponds to each memory block 142, 144 in the memory system 140. As such, assuming an example implementation in which the memory system 140 includes sixty-four (64) memory blocks 142, 144, the access history table 122 would include sixty-four (64) entries. In one exemplary scheme, the entries in the access history table 122 may each include one or more bits to represent the age associated with the corresponding memory block 142, 144, wherein the age may initially be set to a maximum value (e.g., based on a duty cycle associated with the memory system 140). Accordingly, the access history table 122 may be periodically updated (e.g., every N clock cycles or another suitable interval) such that the bits representing the age(s) associated with any memory blocks 142, 144 that were accessed during the most recent interval may be maintained and the bits representing the age(s) associated with memory blocks 142, 144 that were not accessed during the most recent interval may be decreased. The one or more bits in the access history table 122 may therefore have an inverse relationship to the ages associated with each memory block 142, 144, in that memory blocks 142, 144 that have a lower value in the access history table 122 may be considered "older" (i.e., have a greater age) than memory blocks 142, 144 that have a higher value in the access history table 122. However, those skilled in the art will appreciate that other suitable schemes may be used to track the access-dependent age associated with each memory block 142, 144.

According to various embodiments, in response to the access history table 122 indicating that the age associated with a particular memory block 142, 144 has crossed an appropriate threshold, the memory controller 120 may send a suitable signal to the power management circuit 150 to transition the memory block 142, 144 to a power state that consumes less leakage power. For example, a memory block 142, 144 that stores valid data may initially operate in the active state with the bits that represent the age associated therewith set to the maximum value. Accordingly, the memory block 142, 144 may be transitioned to the intermediate low-leakage state once the value associated with the age bits crosses a first threshold due to sufficient intervals elapsing without the memory controller 120 receiving any requests to access the memory block 142, 144. Furthermore, the memory block 142, 144 may subsequently transition to the retention state once the value associated with the age bits crosses a second threshold due to additional intervals elapsing without any requests to access the memory block 142, 144 and eventually transition to the power-down state in the event that there are no requests to access the memory block 142, 144 and the value associated with the age bits crosses a third threshold. Additionally, in various embodiments, any memory blocks 142, 144 in the intermediate low-leakage state, the retention state, and/or another low-leakage state may be transitioned to the active state in response to a request to access such memory blocks 142, 144, while any memory blocks 142, 144 operating in the active state may be maintained in the active state in response to the processor 110 requesting access thereto. In various embodiments, when one or more memory blocks 142, 144 are transitioned from a low-leakage power state to the active state, the bits that represent the age associated therewith may be reset to the maximum value or to a value in a range between the maximum value and the threshold that triggers the transition to exit the active state, wherein the decision about how to manage the age associated with memory blocks 142, 144 transitioned to the active state may be implementation-dependent.

According to various aspects, as mentioned above, there may be a latency associated with waking memory blocks 142, 144 from the low-leakage power states and/or otherwise transitioning memory blocks 142, 144 between different power states. Furthermore, transitioning memory blocks 142, 144 to the power-down state may have a cost in that any data stored therein will be lost. As such, in various embodiments, the access history table 122 may further include one or more bits that can be configured to pin certain memory blocks 142, 144 to the active state, to prevent certain memory blocks 142, 144 from transitioning to the power-down state, and/or to trigger an automatic transition to the power-down state. For example, in various embodiments, each entry in the access history table 122 may include a field to indicate whether the corresponding memory block 142, 144 is to be pinned to the active state (e.g., because the corresponding memory block 142, 144 contains key operating system data or other data that needs to remain accessible), whereby such memory blocks 142, 144 may be maintained in the active state regardless of the age associated therewith. Furthermore, the entries in the access history table 122 may include additional fields that can be set to block the corresponding memory blocks 142, 144 from transitioning to the power-down state to preserve the data stored therein and/or to automatically transition the corresponding memory blocks 142, 144 to the power-down state. For example, in the former case, certain memory blocks 142, 144 may be blocked from transitioning to the power-down state because a temporarily inactive application could potentially need access to the data at some future point in time, while in the latter case, certain memory blocks 142, 144 may be automatically transitioned to the power-down state because an application has provided a signal to indicate that the data stored therein is no longer needed (e.g., via an application program interface), because a task utilizing the data stored in such memory blocks 142, 144 has been cleared from an execution stack, etc. As such, in addition to controlling transitions between the various power states based on the access-dependent age(s) associated with each memory block 142, 144, the memory power reduction scheme described herein may further trigger and/or block transitions between different power states based on various performance-related criteria.

Figure 2A:
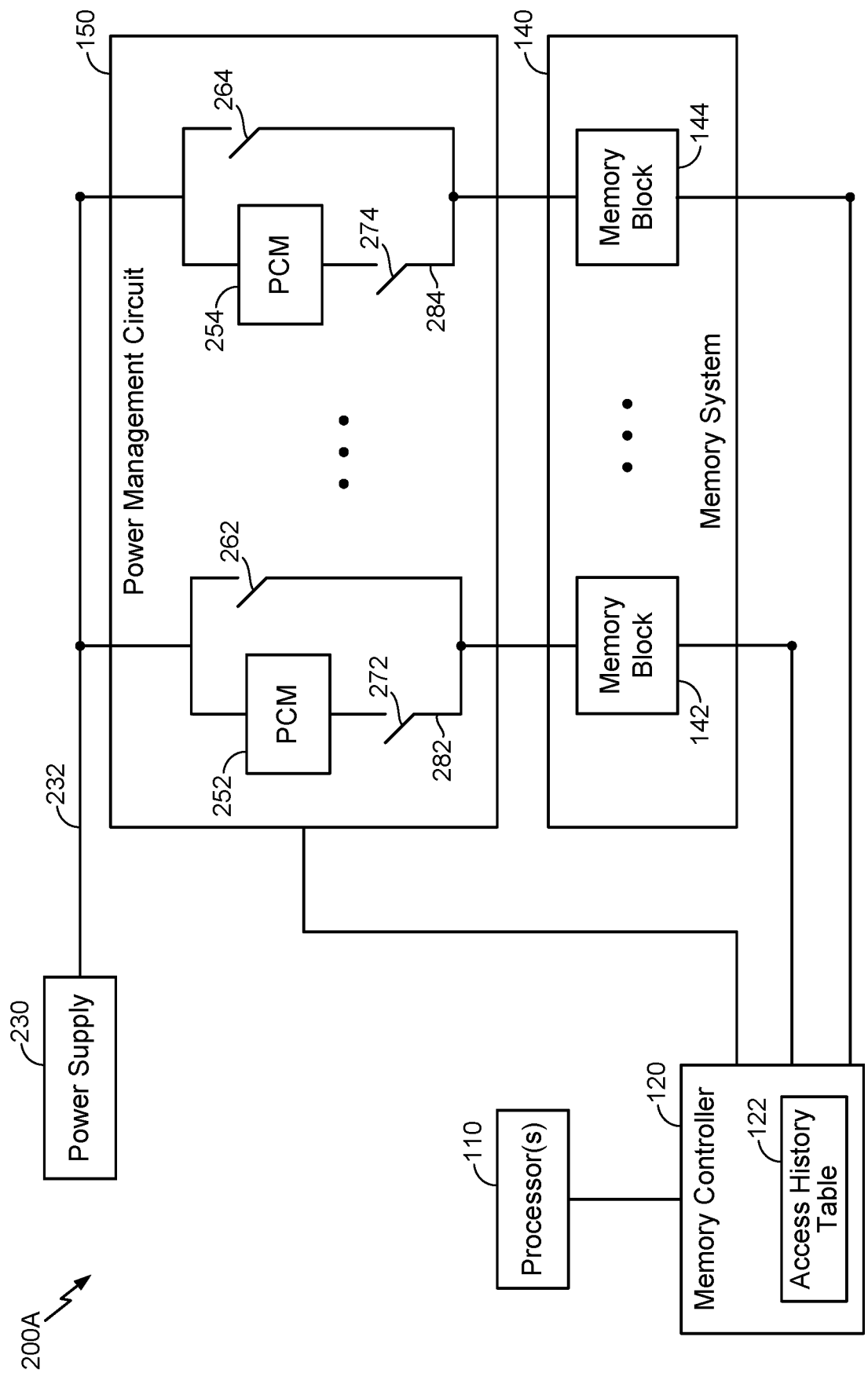
FIG. 2A and FIG. 2B illustrate example power management circuitry that can be used to manage power consumption in a memory circuit, according to various aspects.
Figure 2B:
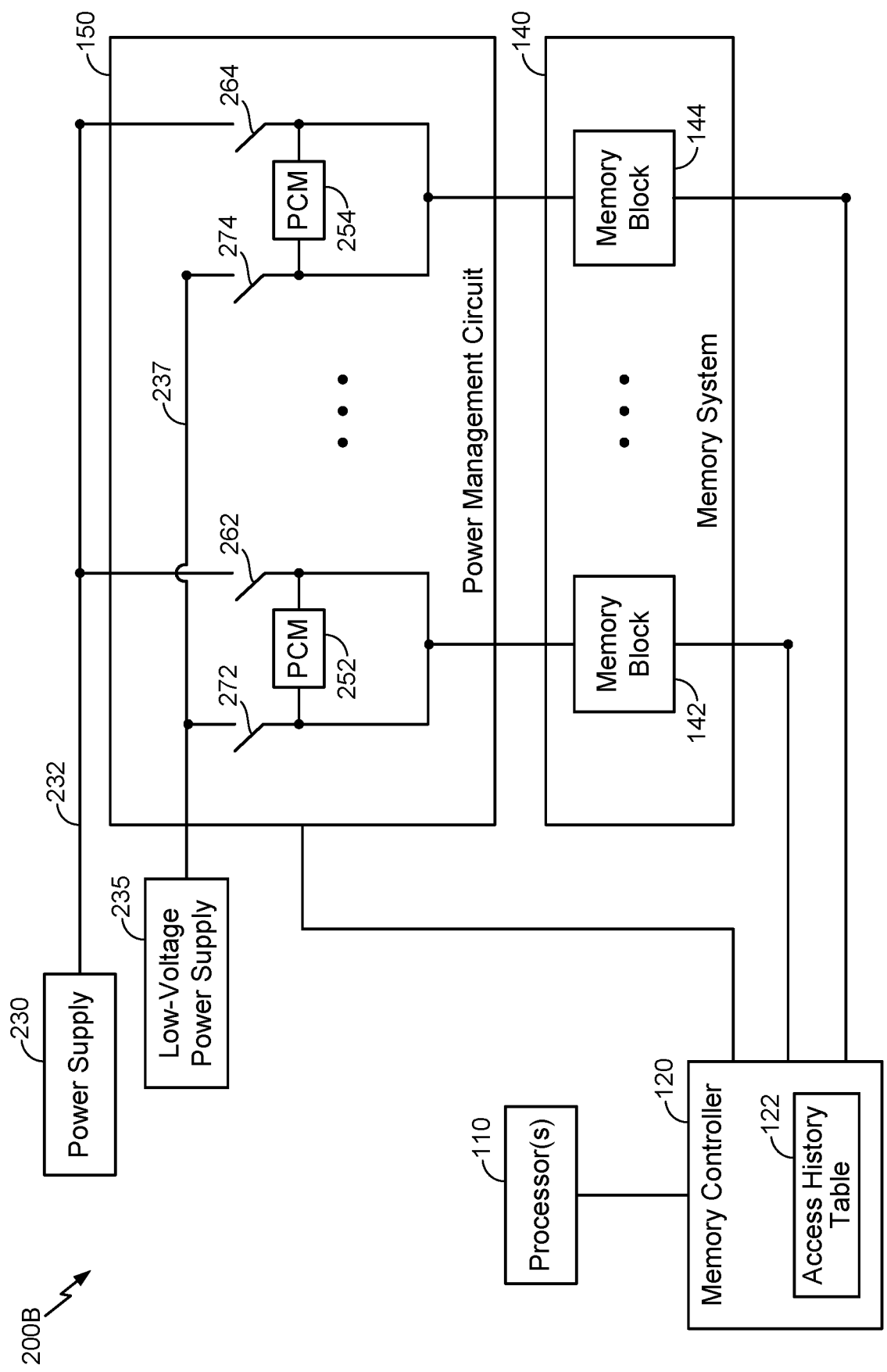

According to various aspects, FIGS. 2A and 2B show example implementations that can be used to realize the memory power reduction scheme described in further detail above. In general, the example implementations shown in FIG. 2A and FIG. 2B are illustrated in architectures 200A, 200B that include various components that are the same or substantially similar to components in the architecture 100 shown in FIG. 1 and therefore have the same reference numerals as shown in FIG. 1. As such, FIG. 2A and FIG. 2B illustrate example circuitry and/or other components that can be implemented in connection with the power management circuit 150 to transition the memory blocks 142, 144 in the memory system 140 among different power states and thereby achieve the memory power reduction scheme described herein. However, those skilled in the art will appreciate that other suitable architectures can be implemented to achieve the memory power reduction scheme described herein without limitation to the particular architectures 200A, 200B shown in FIG. 2A and FIG. 2B, which are exemplary only.

In various embodiments, as shown in FIG. 2A, the power management circuit 150 may be coupled to a shared voltage rail 232 generated at a power supply 230, wherein the shared voltage rail 232 may carry a high voltage that can be supplied to the various memory blocks 142, 144 in the memory system 140. In various embodiments, the shared voltage rail 232 may enter a semiconductor die or package comprising the power management circuit 150 via a single pin. Alternatively, in various embodiments, the shared voltage rail 232 be coupled to the power management circuit 150 using one or more pins that can extend the shared voltage rail 232 to the various memory blocks 142, 144 in the memory system 140. In various embodiments, the pin(s) used to couple the shared voltage rail 232 to the memory blocks 142, 144 in the memory system 140 may depend on various parameters, such as how many memory blocks 142, 144 are provided in the memory system 140, the layout associated with the memory blocks 142, 144, etc. As the shared voltage rail 232 carries a high voltage, the shared voltage rail 232 may be used to power the memory blocks 142, 144 operating in the active state.

In various embodiments, the power management circuit 150 may include one or more power control modules 252, 254 configured to control the power state(s) in which the various memory blocks 142, 144 are operated. Accordingly, the shared voltage rail 232 may be coupled to the power control modules 252, 254, shown in FIG. 2A as coupled to respective individual memory blocks 142, 144. However, those skilled in the art will appreciate that the configuration shown in FIG. 2A is illustrative only, in that the power management circuit 150 may have one power control module 252 to control the voltage supplied to the various memory blocks 142, 144 on an individual basis. In various embodiments, the power control modules 252, 254 may comprise a voltage regulator, a voltage selector, a voltage sequencer, and/or other suitable circuitry that can derive a low voltage output from the high voltage supplied on the shared voltage rail 232. For example, as shown in FIG. 2A, the power control modules 252, 254 may drive the low voltage output derived from the high voltage supplied on the shared voltage rail 232 onto low voltage rails 282, 284, wherein the low voltage output driven on the low voltage rails 282, 284 may generally be less than the voltage carried on the shared voltage rail 232. Accordingly, in various embodiments, the low voltage rails 282, 284 may be used to supply power to the memory blocks 142, 144 that are operating in the intermediate low-leakage state, the retention state, and/or another low-leakage state other than the power-down state. Furthermore, in various embodiments, the power control modules 252, 254 may be programmed to drive the low voltage onto the low voltage rails 282, 284 across a low voltage operating window, which may include a first voltage that can be supplied to memory blocks 142, 144 in the intermediate low-leakage state, a second voltage (lower than the first voltage) that can be supplied to memory blocks 142, 144 in the retention state, and so on to the extent that the memory power reduction scheme may implement additional power states between the active state and power-down state. In addition, as mentioned above, the power control modules 252, 254 may be configured such that the output voltages driven onto the low voltage rails 282, 284 meet the minimum voltage value requirements associated with the various power states in which the memory blocks 142, 144 can operate. For example, when transitioning a memory block 142, 144, etc. to the retention state, the output voltage that the corresponding power control module 252, 254, etc. drives onto the low voltage rails 282, 284 may be the lowest possible at which the corresponding memory block 142, 144 can retain a state associated with. Those skilled in the art will recognize suitable variations and mechanisms to realize the above-mentioned supply voltages that are suitable to operate the memory blocks 142, 144 in the different power states.

In various embodiments, as shown in FIG. 2A, the various memory blocks 142, 144 in the memory system 140 may be electrically connected to the shared voltage rail 232 via respective switches 262, 264 and to respective low voltage rails 282, 284 via respective switches 272, 274. As such, in various embodiments, the memory controller 120 may communicate one or more control signals, instructions, and/or other suitable information to the power management circuit 150 in order to dynamically configure the power state(s) in which the individual memory blocks 142, 144 operate based on the information stored in the access history table 122.

For example, to cause a particular memory block 142 to operate in and/or transition to the active state, the memory controller 120 may send a control signal, instruction, and/or other suitable information to the power management circuit 150, wherein the power management circuit 150 may then close the switch 262 and open the switch 272 such that the high voltage carried on the shared voltage rail 232 is supplied to the memory block 142. Furthermore, to pin the memory block 142 to the active state, the memory controller 120 may instruct the power management circuit 150 to maintain the switch 262 in the closed position and maintain the switch 272 in the open position regardless of the age associated with the memory block 142. Alternatively, the memory controller 120 may simply instruct the power management circuit 150 to configure the memory block 142 to operate in the active state and not send any further control signals to the power management circuit 150 with respect to memory block 142 as long as the memory block 142 is to be pinned to the active state.

Additionally, to cause the particular memory block 142 to operate in and/or transition to the intermediate low-leakage state, the retention state, and/or another low-leakage power state, the memory controller 120 may send an appropriate control signal, instruction, and/or other suitable information to the power management circuit 150. In response thereto, the power management circuit 150 may open the switch 262 and close the switch 272 such that the voltage carried on the low voltage rail 282 is supplied to the memory block 142. In various embodiments, the power management circuit 150 may further inform the power control module 252 about the appropriate low-leakage power state in which the memory block 142 is to be operated such that the power control module 252 may drive the appropriate low voltage output onto the low voltage rail 282. For example, to operate the memory block 142 in the intermediate low-leakage state, the low output voltage that the power control module 252 drives onto the low voltage rail 282 may have a relatively high value within the above-mentioned operating window, or alternatively drive the low voltage rail 282 at the lowest possible voltage to retain the state associated with the memory block 142 in the retention state, and so on.

Furthermore, in various embodiments, the memory controller 120 may cause the power management circuit 150 to open both the switch 262 and the switch 272 in order to cause the memory block 142 to operate in and/or transition to the power-down state. Accordingly, when both the switch 262 and the switch 272 are open, substantially no voltage may be supplied to the memory block 142, whereby the memory block 142 may consume substantially no leakage power. However, as mentioned above, any data stored in memory blocks 142, 144 transitioned to the power-down state would be lost. Moreover, transitioning memory blocks 142, 144 from the power-down state (e.g., in response to a subsequent access request) may have a substantial performance penalty with respect to a wake-up latency and power consumption. Accordingly, in various embodiments, the memory power reduction scheme may implement a conservative age threshold to prevent memory blocks 142, 144 from transitioning to the power-down state while data stored therein may still be needed or alternatively block certain memory blocks 142, 144 from transitioning to the power-down state altogether. However, an application program interface or other suitable mechanism may be used to determine whether and/or when data stored in certain memory blocks 142, 144 is no longer needed such that those memory blocks 142, 144 can be safely transitioned to the power-down state regardless of the age(s) associated therewith.

According to various aspects, FIG. 2B illustrates another example architecture 200B that can be used to realize the memory power reduction scheme described in further detail above. In general, the architecture 200B shown in FIG. 2B may include various components that are the same or substantially similar to components in the architecture 100 shown in FIG. 1 and the architecture 200A shown in FIG. 2A and therefore have the same reference numerals as shown therein.

In various embodiments, the architecture 200B shown in FIG. 2B may differ from the architecture 200A shown in FIG. 2A in that the architecture 200B shown in FIG. 2B includes a high-voltage power supply 230 configured to generate and supply a high voltage on a first shared voltage rail 232 and an independent low-voltage power supply 235 configured to generate and supply a low voltage on a second shared voltage rail 237. Accordingly, in the example implementation shown in FIG. 2B, the power management circuit 150 may be coupled to the first shared voltage rail 232 and the second shared voltage rail 237. Furthermore, in various embodiments, the high-voltage power supply 230 and the low-voltage power supply 235 may be external to the power management circuit 150, or in the alternative, the high-voltage power supply 230 and/or the low-voltage power supply 235 may comprise on-die power supplies that are internal to the power management circuit 150, the memory controller 120, one or more semiconductor dies that include the memory blocks 142, 144 forming the memory system 140, etc. In any case, the shared voltage rails 232, 237 may be derived from the high-voltage power supply 230 and the low-voltage power supply 235 and configured to supply a high voltage and a low voltage, respectively. The various memory blocks 142, 144 in the memory system 140 may be electrically connected to the shared voltage rails 232, 237 using high power switches 262, 264 and low power switches 272, 274, respectively. Furthermore, the power management circuit 150 may include one or more power control modules 252 configured to control the high power switches 272, 274 and the low power switches 272, 274 as shown.

In various embodiments, duty cycles associated with the high-voltage power supply 230 and the low-voltage power supply 235 can be controlled to achieve a target power state for each of the memory blocks 142, 144. For example, the memory blocks 142, 144 may have higher performance (e.g., higher throughput, lower latency, etc.) and higher leakage power in the above-described active state and progressively lower performance and progressively lower leakage power in the above-described intermediate, retention, and power-down states. The memory blocks 142, 144 may be therefore operated in and/or transitioned to the active state when coupled to the high-voltage power supply 230, operated in and/or transitioned to a state that consumes less leakage power when coupled to the low-voltage power supply 235, and operated in and/or transitioned to a state that consumes substantially no leakage power when decoupled from the high-voltage power supply 230 and the low-voltage power supply 235. In various embodiments, any desired target power state (and corresponding performance level) implemented according to the memory power reduction scheme described herein may therefore be achieved with respect to individual memory blocks 142, 144 via proportionally controlling the time that the memory blocks 142, 144 operate in high and low performance modes via coupling to high and low voltage power sources, wherein the relative times that the memory blocks 142, 144 operate in the high and low performance modes may be measured in terms of duty cycles.

For example, in various embodiments, the high-voltage power supply 230 may be a shared network that can carrying voltage values in a high-voltage range (e.g., from 1-1.1V) whereas the low-voltage power supply 235 may be a shared network that can carry voltage values in a low-voltage range (e.g., from 0.6-0.7V). In this illustrative example, a particular memory block 142, 144 may be configured to operate in the active state when coupled to the highest voltage value in the high-voltage range (e.g., 1.1V) and the retention state when coupled to the lowest value in the low-voltage range (e.g., 0.6V or the lowest voltage at which the state associated therewith van be retained). Furthermore, a particular memory block 142, 144 may be configured to operate in the intermediate low-leakage state (and/or any other intermediate low-leakage states between the active state and the retention state) through controlling the corresponding high power switch 262, 264 and the corresponding low power switch 272, 274 and thereby controlling the time that the memory block 142, 144 is coupled to the high-voltage power supply 230 and the low-voltage power supply 235 in a given time unit. As such, in various embodiments, the power control modules 252, 254 in the power management circuit 150 can be configured to control the high power switches 262, 264 and the low power switches 272, 274 accordingly. The duty cycle relative to each of the high-voltage power supply 230 and the low-voltage power supply 235 may be defined as the time that the respective power supply 230, 235 is used to supply power to the corresponding memory 142, 144 through controlling the corresponding high power switches 262, 264 and the corresponding low power switches 272, 274 in a given time unit. Furthermore, the power control modules 252, 254 need not be separate components as shown in FIG. 2B, as the power control modules 252, 254 may instead be unified into a global control that can be placed in any location within the architecture 200B depending on particular implementation needs. In various embodiments, the power control modules 252, 254 and/or the power management circuit 150 may be located on the same chip as the memory controller 120, the memory blocks 142, 144, etc. or the related functionality associated with the power control modules 252, 254 and/or the power management circuit 150 may be performed using software algorithms.

In various embodiments, continuing with the above-described illustrative example, the voltage values within the high-voltage range and the low-voltage ranges may be altered in addition to and/or rather than controlling the duty cycles in order to achieve the desired target power state/performance level. For example, the duty cycles could be fixed at a constant value, whereby particular voltage values within the high-voltage range and the low-voltage range may be selected in order to achieve the desired target power state with respect to each memory block 142, 144 based on the fixed duty cycle. As such, the ability to control voltage values within both the high-voltage range and the low-voltage range as well as possibly controlling the duty cycles as described above may provide fine-tuned control to achieve desired target power states and performance levels in various embodiments. Furthermore, although not explicitly illustrated in FIG. 2B, more than two power sources may be provided to achieve the target power states that are implemented according to the memory power reduction scheme described herein. For example, in addition to the high-voltage power supply 230 and the low-voltage power supply 235, a third mid-range power supply may be provided in cases where there is a substantial gap between the high-voltage range and the low-voltage range. Accordingly, in various embodiments, there may be various ways to configure the voltage supplied to each memory block 142, 144 and thereby flexibly achieve target power states that provide suitable performance levels and leakage-power consumption. For example, the power delivered to the individual memory blocks 142, 144 may combine power delivery schemes as described above with regard to FIG. 2A and FIG. 2B (e.g., a low-voltage power source for some memory blocks 142, 144 can be derived from an external low voltage power supply while other memory blocks 142, 144 may derive a low-voltage power source from a high-voltage power source as described above with respect to FIG. 2A). Accordingly, various architectures may suitably combine the various components and exemplary functionality described in further detail above on a particular integrated circuit or alternatively distribute the components and/or functionality among different integrated circuits.

Figure 3:
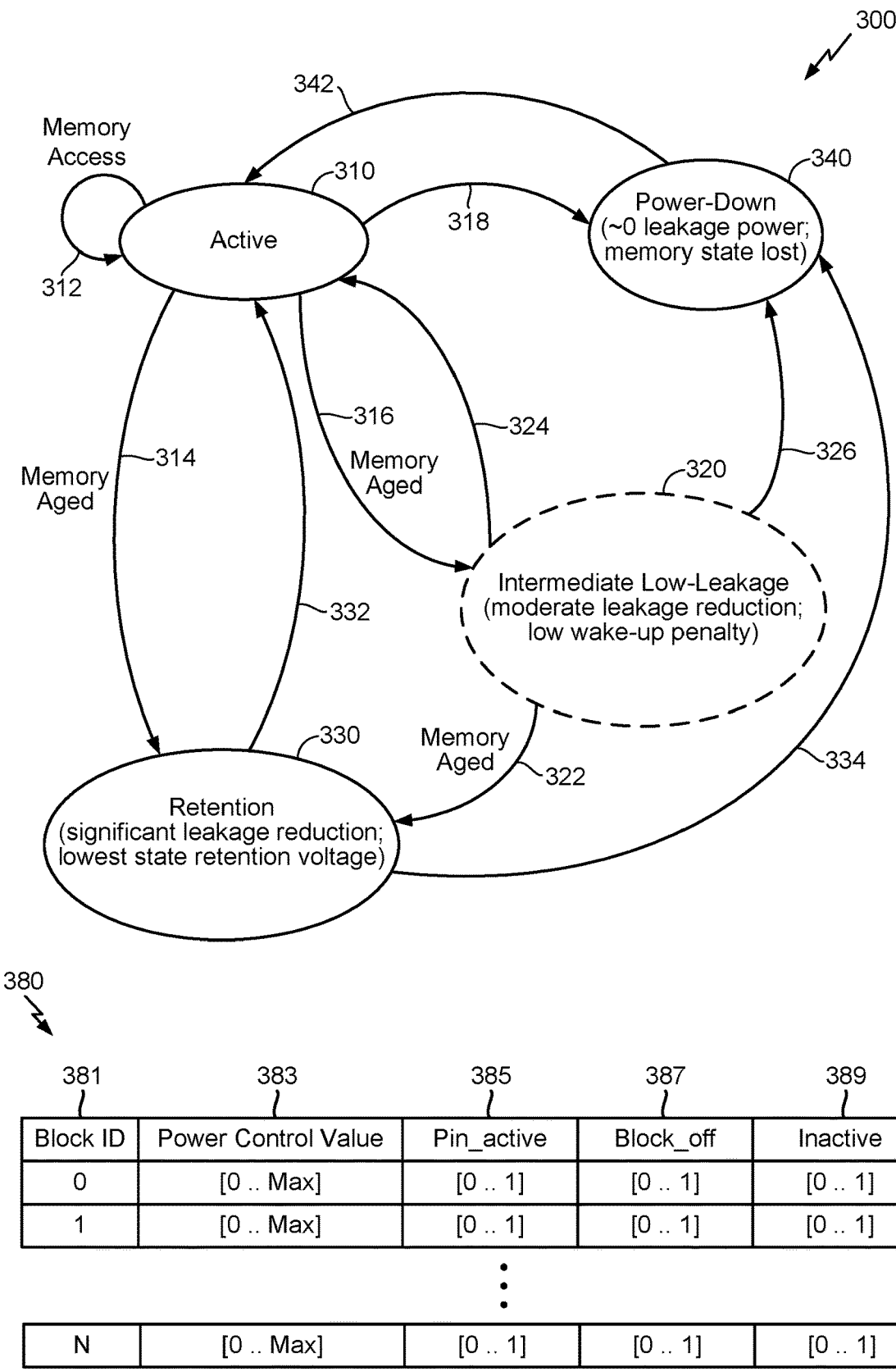
FIG. 3 illustrates an example state transition diagram that can be used to manage memory circuit power consumption, according to various aspects.

According to various aspects, FIG. 3 illustrates an example state transition diagram 300 that can be used to manage memory circuit power consumption based on the memory power reduction scheme described herein. More particularly, the example state transition diagram 300 may generally represent possible states in which any one individual memory block can be operated, wherein the state transition diagram 300 shown in FIG. 3 assumes an implementation with four possible power states, including an active state 310, an intermediate low-leakage state 320, a retention state 330, and a power-down state 340. In general, the active state 310 may consume the most power among the various possible power states and the retention state 330 may operate a memory block in such a way that the memory block can retain the state associated therewith (e.g., via operating the memory block at a lowest possible voltage at which the memory block can retain the state associated therewith or using other appropriate control signals, circuitry, etc. to ensure that the memory state is not lost). Furthermore, the intermediate low-leakage state 320 may consume power at a level between the active state 310 and the retention state 330, while the power-down state 340 may consume the least power (substantially zero), although any data stored in memory blocks operating in the power-down state 340 may be lost. Furthermore, as described in further detail above, an individual memory block can be transitioned between the various power states 310, 320, 330, 340, etc. according to an access-dependent age associated with the memory and/or other suitable performance-related criteria. A state change can be effected based solely on a change to the operating voltage, solely on a control signal, and/or any suitable combination of those and other factors (e.g., the same voltage may be used to operate a memory block in different power states with the difference in leakage power, performance, etc. effected through control signals and/or other suitable mechanisms used to configure the operation of the memory block).

For example, according to various embodiments, FIG. 3 illustrates an example access history table 380 with various entries, each entry corresponding to one memory block. Accordingly, in the example access history table 380 shown in FIG. 3, each entry may include a Block ID 381 to uniquely identify a particular memory block and a power control value 383 to represent the age associated therewith. In various embodiments, the power control value 383 may have a maximum value (Max), which may be based on a duty cycle associated with a memory system in which the memory blocks are implemented, wherein each memory block may have an initial power control value 383 set to the maximum value. Accordingly, requests to access the memory blocks can be evaluated at periodic intervals, wherein any memory blocks that are not accessed in a particular interval may be aged via decreasing the power control value 383 associated therewith. However, any memory blocks that are accessed in the particular interval may be maintained. As such, the power control value 383 may generally range from zero (0) to the maximum value, wherein various thresholds may be defined to transition a memory block to a lower-leakage power state when the power control value 383 associated with the memory block crosses the applicable threshold.

The power control value 383 that represents the access-dependent age associated with each memory block may therefore exploit benefits associated with data locality to place unused (or underused) memory blocks in the intermediate low-leakage state 320, the retention state 330, and/or other suitable low-leakage states in order to meet desired performance levels and reduce leakage power. For example, based on empirical observation, application programs have a well-known tendency to repeatedly access the same memory location(s), referred to as temporal locality, as well as to access nearby memory location(s) (e.g., within the same or neighboring memory blocks), referred to as spatial locality. In general, the data locality principle underlies many (if not all) cache implementations, which store data contained in recently accessed memory locations to provide low latency and high bandwidth access to such data. As such, the memory power reduction scheme described herein may similarly exploit data locality principles to improve performance and reduce power consumption based on the access-dependent age associated with memory blocks implemented in a main memory.

However, as mentioned above, certain memory blocks may store important data (e.g., key operating system blocks), while others may store data that is still needed despite not having been recently accessed (e.g., where an application using the data is running in the background or stalled while other higher-priority applications are accessing memory locations), while still others may store data that was recently accessed but no longer needed (e.g., where an application or task using the data has been cleared from an execution stack). As such, in various embodiments, the access history table 380 may include various additional fields to further optimize transitions among the various power states 310, 320, 330, 340. For example, the access history table 380 may include a Pin_active field 385 that can be set to one (1) in order to pin a memory block to the active state 310 the power control value 383 or set to zero (0) to permit the memory block to be transitioned to lower-leakage power states 320, 330, 340, etc. based on the power control value 383. Furthermore, the access history table 380 may include a Block_off field 387 that can be set to one (1) to prevent a memory block from transitioning to the power-down state 340 regardless of the power control value 383 associated therewith or set to zero (0) to permit the memory block to be transitioned to the power-down state 340 when the power control value 383 crosses the appropriate threshold. Further still, the access history table 380 may include an Inactive field 389 that can be set to one (1) to automatically transition a memory block to the power-down state 340 regardless of the power control value 383 associated therewith or set to zero (0) to allow the memory block to be transitioned among the various power states 310, 320, 330, 340 normally (depending on the value(s) associated with the Pin_active field 385 and/or the Block_off field 387).

Accordingly, assuming a memory block currently operating in the active state 310, the memory block may be maintained in the active state 310 in the event that there is a request to access the memory block during a particular interval, as depicted at 312. Alternatively, assuming that the memory block is currently in the intermediate low-leakage state 320, the retention state 330, and/or the power-down state, a hardware mechanism may automatically transition the memory block to the active state 310 with minimal delay via appropriate control signals in response to a request to access the memory block, as depicted at 324, 332, and 342. Furthermore, when the power control value 383 associated with the memory block crosses the appropriate thresholds (e.g., after sufficient intervals elapse without an access request such that the memory block has aged due to non-use), the memory block may be transitioned to a low-leakage power state 320, 330 or the power-down state 340 depending on the power control value 383, as depicted at 314, 316, 318, 322, 326, and 334. Furthermore, in various embodiments, one or more transitions may depend on the various additional fields in the access history table 380, such as the Pin_active field 385, the Block_off field 387, and the Inactive field 389. For example, in the event that the Pin_active field 385 is set to (1), a memory block in the active state 310 will always follow memory access transition 312 regardless of the power control value 383 associated therewith, while any memory blocks in the intermediate low-leakage state 320, the retention state 330, or the power-down state 340 will respectively follow transitions 324, 332, and 342 and subsequently follow memory access transition 312 to stay in the active state 310. Furthermore, in the event that a memory block has the Block_off field 387 set to (1), the memory block will be prevented from following transitions 318, 326, 334 regardless of the power control value 383 associated therewith, while a memory block that has the Inactive field 389 set to (1) will automatically follow transition 318, 326, or 334 (depending on the current state) regardless of the power control value 383.

Figure 4:
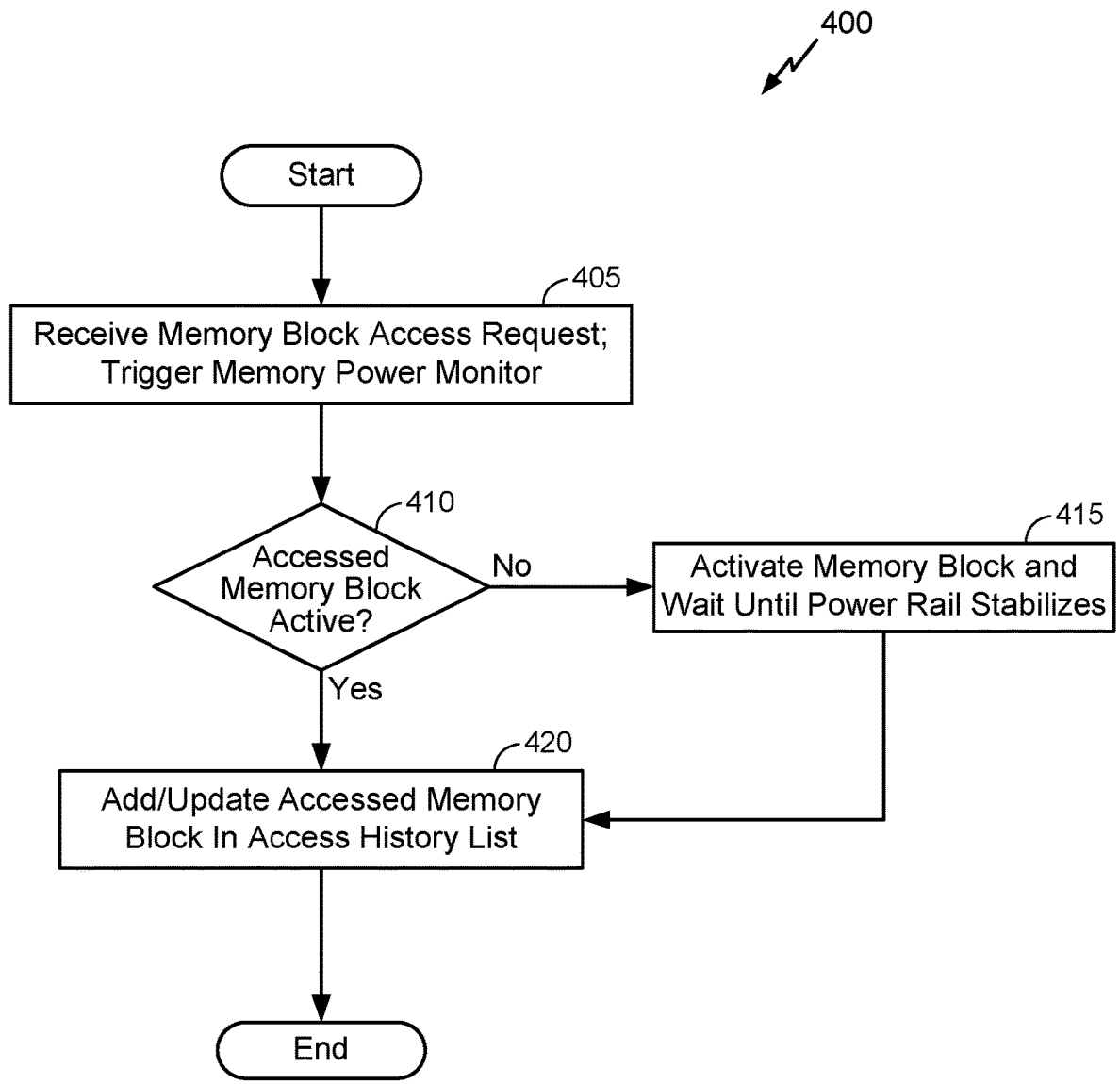
FIG. 4 illustrates an example method that can be used to manage memory circuit power consumption, according to various aspects.

According to various aspects, FIG. 4 illustrates an example method 400 that can implement the memory power reduction scheme described herein. In particular, at block 405, a request to access a particular memory block may be received. In various embodiments, at block 410, a determination may be made with respect to whether the memory block to which access was requested is in the active state. In response to determining that the accessed memory block is not in the active state (e.g., the memory block is currently in a powered down state, a retention state, an intermediate low-leakage state, etc.), a suitable hardware mechanism may be configured to transition the memory block to the active state at block 415. For example, in various embodiments, block 415 may comprise activating one or otherwise configuring one or more power rails to supply power to the memory block at a suitable level and then waiting until the one or more power rails have stabilized. In various embodiments, after determining that the one or more power rails have stabilized or alternatively that the accessed memory block was already in the active state, the request to access the memory block may be serviced (e.g., reading data from and/or writing data to the memory block). At block 420, an entry associated with the accessed memory block may then be added to and/or updated in an access history list that tracks access requests to individual memory blocks. In particular, if the memory block was not in the active state at the time that the access request was received, block 420 may comprise setting/resetting a power control value associated with the memory block to an appropriate value. For example, the power control value may be set to the initial value or to another suitable intermediate value depending on implementation-dependent criteria (e.g., the power control value may be set to a value that is farther away from the threshold value(s) that trigger a transition from the active state to a low-leakage state if the memory block was transitioned from the intermediate low-leakage state as the memory block may be assumed to be more likely to be accessed again as opposed to a memory block that was in the power-down or retention state following a longer inactivity period).

Figure 5:
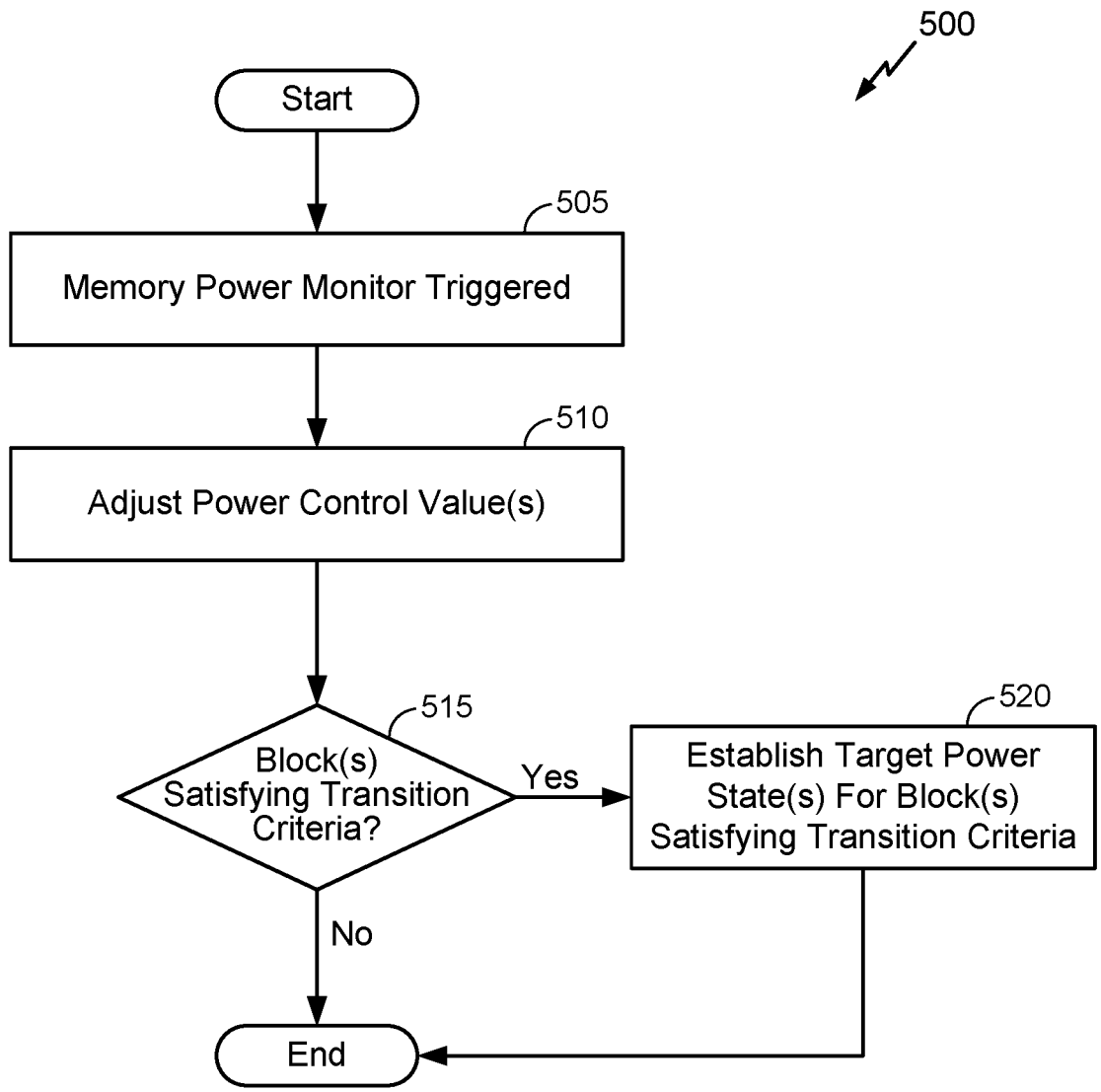
FIG. 5 illustrates an example method that can be used to generate control signals to transition memory blocks among different power states, according to various aspects.

According to various aspects, FIG. 5 illustrates an example method 500 that can be used to generate control signals to transition memory blocks among different power states and thereby implement the memory power reduction scheme described herein. In particular, at block 505, a memory power monitor may be triggered in response to one or more suitable events (e.g., a request to access a memory block, a current monitor interval having elapsed, etc.). Accordingly, in various embodiments, the process in FIG. 5 can be implemented synchronously or asynchronously with respect to the process 400 illustrated in FIG. 4 (e.g., in conjunction with and/or independent from any request(s) to access one or more memory blocks). In various embodiments, a power control value associated with one or more memory blocks may be adjusted at block 510. For example, in various embodiments, any memory blocks that were not accessed since the last time that the memory power monitor was triggered may be identified and the power control value associated therewith may be incremented or decremented to indicate an increase in an access-dependent age associated with such memory block(s). As such, the change in the power control value associated with the memory blocks that were not accessed since the last time that the memory power monitor was triggered may effectively increase the age associated with such memory blocks, wherein the initial power control value may be set to zero and incremented in each monitoring interval that the memory block is not accessed, set to a maximum and decremented in each monitoring interval that the memory block is not accessed, etc.

In various embodiments, adjusting the memory block power control values at block 510 may further comprise maintaining the power control value associated with any memory blocks that were accessed since the last time that the memory power monitor was triggered at the current value. As such, maintaining the power control value associated with accessed memory blocks may exploit the data locality principles mentioned above, whereby memory blocks that are not accessed may be aged and memory blocks that are accessed are not aged based on the likelihood that accessed memory blocks are more likely to be accessed again based on applications tending to exhibit spatial and temporal locality with respect to accessed memory locations.

In various embodiments, adjusting the memory block power control values at block 510 may further comprise setting and/or resetting the power control value(s) associated with one or more memory blocks that were accessed and further transitioned from a low-leakage state to the active state. For example, as mentioned above, the power control values associated with the activated memory blocks may be reset to the maximum value or to another suitable value depending on implementation-dependent criteria (e.g., the power control value may be set to a higher value if the memory block was transitioned from the intermediate low-leakage state as opposed to the retention state and/or the power-down state based on the memory block having a lower age at the time that the memory block was activated, which may suggest that the memory block is more likely to be accessed again than a memory block that had been powered down or in the retention state due to a longer inactivity period).

In various embodiments, a determination may then be made at block 515 with respect to whether one or more memory blocks satisfy state transition criteria (e.g., due to the age crossing a threshold, an indication that the memory block is to be pinned to the active state, an indication that the memory block is storing data that is no longer needed, etc.). In response to determining that no memory blocks satisfy state transition criteria, the method 500 may end until the next time that the memory power monitor is triggered. Alternatively, in the event that one or more memory blocks are found to satisfy state transition criteria, the appropriate target power state(s) associated with such memory block(s)

may be established at block 520 and the method 500 may then be terminated until the next time that the memory power monitor is triggered.

Figure 6:
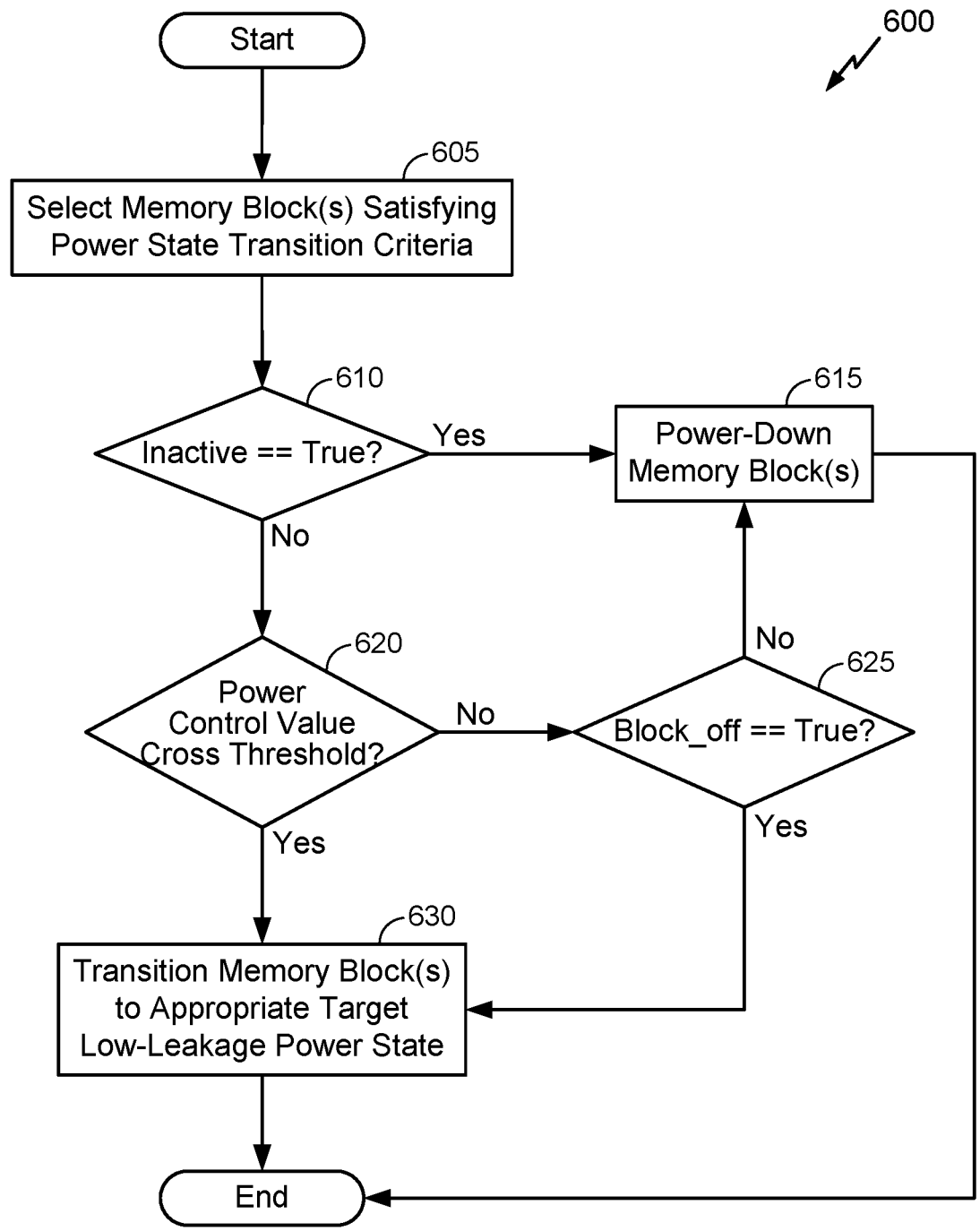
FIG. 6 illustrates an example method that can be used to transition memory blocks to low-leakage power states, according to various aspects.

According to various aspects, FIG. 6 illustrates an example method 600 that can be used to transition memory blocks to low-leakage power states. More particularly, the method 600 shown in FIG. 6 may generally assume that one or more memory blocks that satisfy power state transition criteria have been identified, whereby such memory block(s) may be selected at block 605. As such, the following description may generally detail the various criteria considered in determining the target low-leakage power state associated in terms that relate to an individual memory block. However, those skilled in the art will appreciate that substantially the same considerations may apply to each memory block that satisfies power state transition criteria. Furthermore, the various blocks shown in FIG. 6 need not be performed in any particular order or in sequence, as actual implementations may essentially consider the various factors in parallel when transitioning the memory block(s) to a suitable low-leakage power state.

In various embodiments, an entry in an access history table that corresponds to a memory block that satisfies power state transition criteria may be evaluated at block 610 to determine whether the memory block has been indicated to be inactive (e.g., storing data that may no longer be needed). In response to determining that the memory block is inactive, the memory block may be powered down at block 615. Otherwise, the power control value associated with the memory block may be evaluated at block 620 to determine whether the power control value is above or below the threshold to power down the memory block. In response to determining that that the power control value is not above the power-down threshold, a further determination may be made at block 625 with respect to whether the memory block is blocked from transitioning to the power-down state. As such, the memory block may be powered down at block 615 in the event that the memory block is not blocked from transitioning to the power-down state. However, in response to determining at block 625 that the memory block is blocked from transitioning to the power-down state or alternatively determining at block 620 that the power control value is above the power-down threshold, the memory block may be transitioned to (or maintained in) an appropriate target low-leakage power state at block 630. For example, at block 630, the memory block may be transitioned to or maintained in the intermediate low-leakage power state, the retention state, or other suitable low-leakage power state (e.g., via a control signal, a change in the operational voltage used to power the memory block, etc.).

According to various aspects, the memory power reduction scheme described herein may be provided in, integrated into, or otherwise implemented in any suitable integrated circuit and/or processor-based device comprising one or more integrated circuits, wherein such integrated circuits and/or processor-based devices may include, without limitation, microprocessor-based integrated circuits, systems, or other suitable electronic device(s). For example, processor-based electronic devices that can include or otherwise employ the memory power reduction scheme described herein can comprise mobile phones, cellular phones, computers, portable computers, desktop computers, personal digital assistants (PDAs), monitors, computer monitors, televisions, tuners, radios, satellite radios, digital music players, portable music players, digital video players, digital video disc (DVD) players, portable digital video players, etc.

Figure 7:
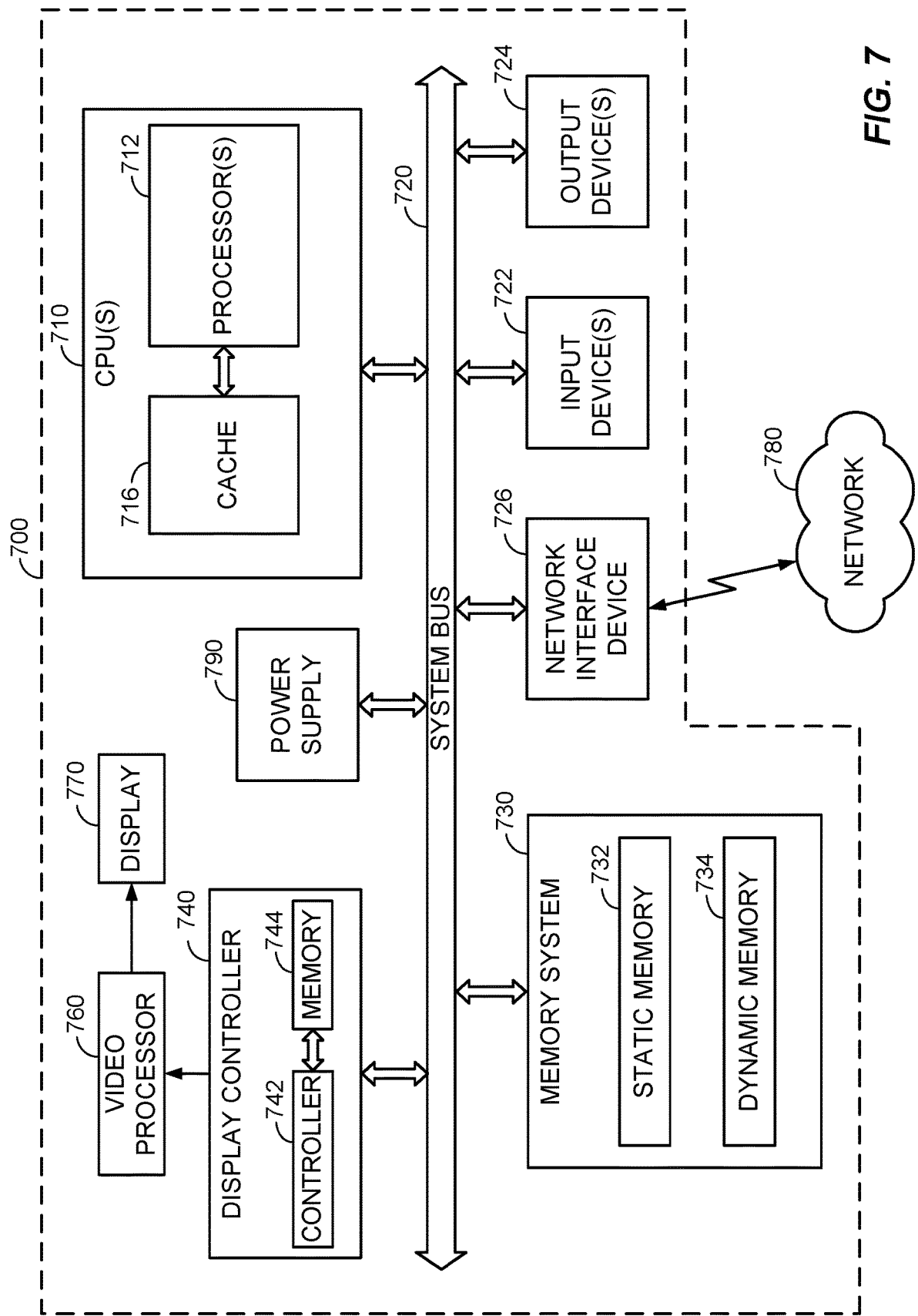
FIG. 7 illustrates an example processor-based device with one or more memory circuits that can be controlled according to the power management scheme described herein, according to various aspects.

For example, according to various aspects, FIG. 7 illustrates an example processor-based system 700 that may implement the memory power reduction scheme described in further detail above. In various embodiments, the processor-based system 700 may include one or more central processing units (CPUs) 710, which may each include one or more processors 712. The CPU(s) 710 may have a cache memory 716 coupled to the processor(s) 712 to rapidly access temporarily stored data. The CPU(s) 710 can be further coupled to a system bus 720, which can intercouple various master devices and slave devices included in the processor-based system 700. Furthermore, as would be apparent to those skilled in the art, the CPU(s) 710 may exchange address, control, and data information over the system bus 720 to communicate with these other devices. For example, the CPU(s) 710 can communicate bus transaction requests to a memory system 730 in which the memory power reduction scheme described herein may be implemented. Furthermore, although not explicitly illustrated in FIG. 7, those skilled in the art will appreciate that the processor-based system 700 shown in FIG. 7 may include multiple system buses 720, in which case the multiple system buses 720 may each constitute a different fabric.

According to various aspects, other devices can also be connected to the system bus 720. For example, as illustrated in FIG. 7, the devices connected to the system bus 720 can include the memory system 730, one or more input devices 722, one or more output devices 724, one or more network interface devices 726, one or more display controllers 740, and a power supply 790 that can deliver power to any components connected to the system bus 720. The input device(s) 722 can include any type of input device, including but not limited to input keys, switches, voice processors, etc. The output device(s) 724 can include any type of output device, including but not limited to audio, video, other visual indicators, etc. The network interface device(s) 726 can be any device configured exchange data to and from a network 780. The network 780 can be any type of network, including but not limited to a wired or wireless network, private or public network, a local area network (LAN), a wide local area network (WLAN), and the Internet. The network interface device(s) 726 can be configured to support any type of communication protocol desired. The memory system 730 can include static memory 732 and/or dynamic memory 734, which as noted above, may have one or more memory blocks that can be transitioned among different power states according to the memory power reduction scheme described herein.

According to various aspects, the CPU(s) 710 may also be configured to access the display controller(s) 740 over the system bus 720 to control information sent to one or more displays 770. The display controller 740 can include a controller 742 and a memory 744 to store data to be sent to the display(s) 770 in response to communications with the CPU(s) 710, wherein the memory 744 associated with the display controller 740 may also include one or more memory blocks that can be transitioned among different power states according to the memory power reduction scheme described herein. As such, the display controller(s) 740 may send information to the display(s) 770 to be displayed via one or more video processors 760, which may process the information to be displayed into a format suitable for the display(s) 770. The display(s) 770 can include any type of display, including but not limited to a cathode ray tube (CRT), a liquid crystal display (LCD), a plasma display, etc.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those skilled in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted to depart from the scope of the various aspects and embodiments described herein.

The various illustrative logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The methods, sequences and/or algorithms described in connection with the aspects disclosed herein may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of non-transitory computer-readable medium known in the art. An exemplary non-transitory computer-readable medium may be coupled to the processor such that the processor can read information from, and write information to, the non-transitory computer-readable medium. In the alternative, the non-transitory computer-readable medium may be integral to the processor. The processor and the non-transitory computer-readable medium may reside in an ASIC. The ASIC may reside in an IoT device. In the alternative, the processor and the computer-readable medium may reside as discrete components in a user terminal.

In one or more exemplary aspects, the functions described may be implemented in hardware, software, firmware, or any combination thereof. If implemented in software, the functions may be stored on or transmitted over as one or more instructions or code on a non-transitory computer-readable medium. Computer-readable media may include storage media and/or communication media including any non-transitory medium that may facilitate transferring a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, DSL, or wireless technologies such as infrared, radio, and microwave, then the coaxial cable, fiber optic cable, twisted pair, DSL, or wireless technologies such as infrared, radio, and microwave are included in the definition of a medium. The term disk and disc, which may be used interchangeably herein, includes CD, laser disc, optical disc, DVD, floppy disk, and Blu-ray discs, which usually reproduce data magnetically and/or optically with lasers. Combinations of the above should also be included within the scope of computer-readable media.

While the foregoing disclosure shows illustrative aspects and embodiments, those skilled in the art will appreciate that various changes and modifications could be made herein without departing from the scope of the disclosure as defined by the appended claims. Furthermore, in accordance with the various illustrative aspects and embodiments described herein, those skilled in the art will appreciate that the functions, steps and/or actions in any methods described above and/or recited in any method claims appended hereto need not be performed in any particular order. Further still, to the extent that any elements are described above or recited in the appended claims in a singular form, those skilled in the art will appreciate that singular form(s) contemplate the plural as well unless limitation to the singular form(s) is explicitly stated.

What is claimed is:

1. A method for managing memory power consumption, comprising:
    determining whether a memory block operating in an active power state during a current monitoring interval has been accessed or not accessed during the current monitoring interval;
    increasing an age associated with the memory block in response to a determination that the memory block was not accessed in the current monitoring interval;
    determining whether the age associated with the memory block has crossed a threshold that triggers a transition to a low-leakage power state; and
    transitioning the memory block from the active power state to the low-leakage power state in response to the age associated with the memory block crossing the threshold that triggers the transition to the low-leakage power state and one or more performance-related criteria associated with the memory block permitting the transition to the low-leakage power state, wherein data stored in the memory block is retained in the low-leakage power state, and wherein transitioning the memory block from the active power state to the low-leakage power state comprises switching the memory block from a shared voltage rail to a low power voltage rail.

2. The method recited in claim 1, further comprising maintaining the memory block in the active power state in response to the one or more performance-related criteria associated with the memory block pinning the memory block to the active power state regardless of whether the age associated with the memory block has crossed the threshold that triggers the transition to the low-leakage power state.

3. The method recited in claim 1, wherein transitioning the memory block to the low-leakage power state causes the memory block to consume less leakage power and have a greater access latency relative to the active power state.

4. The method recited in claim 3, wherein the low-leakage power state comprises an intermediate low-leakage power state in which the memory block consumes more leakage power and has a lower access latency relative to a retention power state.

5. The method recited in claim 3, wherein the low-leakage power state comprises a retention power state in which the memory block consumes the least power needed to retain the data stored in the memory block.

6. The method recited in claim 1, further comprising maintaining a current value for one or more bits that represent the age associated with the memory block in response to determining that the memory block was accessed in the current monitoring interval.

7. The method recited in claim 1, further comprising transitioning the memory block to a power-down state in response to the one or more performance-related criteria associated with the memory block indicating that the data stored in the memory block does not need to be retained, wherein transitioning the memory block to the power-down state causes the memory block to consume substantially no leakage power.

8. The method recited in claim 1, further comprising:
increasing the age associated with the memory block in response to determining that the memory block was not accessed in one or more subsequent monitoring intervals;
determining whether the age associated with the memory block has crossed a threshold that triggers a transition to a power-down state; and
transitioning the memory block from the low-leakage power state to the power-down state in response to the age associated with the memory block crossing the threshold that triggers the transition to the power-down state and the one or more performance-related criteria associated with the memory block permitting the transition to the power-down state, wherein the data stored in the memory block is not retained in the power-down state.

9. The method recited in claim 8, further comprising maintaining the memory block in the low-leakage power state in response to the one or more performance-related criteria associated with the memory block preventing the transition to the power-down state regardless of whether the age associated with the memory block has crossed the threshold that triggers the transition to the power-down state.

10. The method recited in claim 8, wherein the memory block is transitioned to the power-down state regardless of whether the age associated with the memory block has crossed the threshold that triggers the transition to the power-down state in response to the one or more performance-related criteria associated with the memory block indicating that the data stored in the memory block does not need to be retained.

11. The method recited in claim 1, further comprising:
receiving a request to access the memory block subsequent to transitioning the memory block to the low-leakage power state; and
transitioning the memory block from the low-leakage power state to the active power state in response to the request to access the memory block.

12. The method recited in claim 11, further comprising:
servicing the request to access the memory block in response to determining that the one or more activated power rails have stabilized.

13. An apparatus, comprising:
a memory system comprising multiple memory blocks; and
one or more circuits configured to:
operate at least one of the multiple memory blocks in an active power state;
determine whether a memory block operating in the active power state during a current monitoring interval has been accessed or not accessed during the current monitoring interval;
increase an age associated with the memory block in response to a determination that the memory block was not accessed in the current monitoring interval;
determine whether the age associated with the at least one memory block has crossed a threshold that triggers a transition to a low-leakage power state; and
transition the at least one memory block from the active power state to the low-leakage power state in response to the age associated with the at least one memory block crossing the threshold that triggers the transition to the low-leakage power state and one or more performance-related criteria associated with the at least one memory block permitting the transition to the low-leakage power state, wherein data stored in the at least one memory block is retained in the low-leakage power state, and wherein the transition comprises a switch of the at least one memory block from a shared voltage rail to a low power voltage rail.

14. The apparatus recited in claim 13, wherein the one or more circuits are further configured to maintain the at least one memory block in the active power state in response to the one or more performance-related criteria associated with the at least one memory block pinning the at least one memory block to the active power state regardless of whether the age associated with the at least one memory block has crossed the threshold that triggers the transition to the low-leakage power state.

15. The apparatus recited in claim 13, wherein the at least one transitioned memory block is configured to consume less leakage power and have a greater access latency relative to the active power state.

16. The apparatus recited in claim 15, wherein the low-leakage power state comprises an intermediate low-leakage power state in which the memory block consumes more leakage power and has a lower access latency relative to a retention power state.

17. The apparatus recited in claim 15, wherein the low-leakage power state comprises a retention power state in which the memory block consumes the least power needed to retain the data stored in the memory block.

18. The apparatus recited in claim 13, wherein the one or more circuits are further configured to maintain a current value for one or more bits that represent the age associated with the at least one memory block in response to the at least one memory block being accessed in the current monitoring interval.

19. The apparatus recited in claim 13, wherein the one or more circuits are further configured to transition the at least one memory block to a power-down state in response to the one or more performance-related criteria associated with the at least one memory block indicating that the data stored in the at least one memory block does not need to be retained, wherein the at least one memory block is configured to consume substantially no leakage power in the power-down state.

20. The apparatus recited in claim 13, wherein the one or more circuits are further configured to:
increase the age associated with the at least one memory block in response to the at least one memory block not being accessed in one or more subsequent monitoring intervals;
determine whether the age associated with the at least one memory block has crossed a threshold that triggers a transition to a power-down state; and
transition the at least one memory block from the low-leakage power state to the power-down state in response to the age associated with the at least one memory block crossing the threshold that triggers the transition to the power-down state and the one or more performance-related criteria associated with the at least one memory block permitting the transition to the power-down state, wherein the data stored in the at least one memory block is not retained in the power-down state.

21. The apparatus recited in claim 20, wherein the one or more circuits are further configured to maintain the at least one memory block in the low-leakage power state in response to the one or more performance-related criteria associated with the at least one memory block preventing the transition to the power-down state regardless of whether the age associated with the at least one memory block has crossed the threshold that triggers the transition to the power-down state.

22. The apparatus recited in claim 20, wherein the at least one memory block is transitioned to the power-down state regardless of whether the age associated with the at least one memory block has crossed the threshold that triggers the transition to the power-down state in response to the one or more performance-related criteria associated with the at least one memory block indicating that the data stored in the at least one memory block does not need to be retained.

23. The apparatus recited in claim 13, wherein the one or more circuits are further configured to:
receive a request to access the at least one memory block subsequent to the transition to the low-leakage power state; and
transition the at least one memory block from the low-leakage power state to the active power state in response to the request to access the at least one memory block.

24. The apparatus recited in claim 23, wherein the one or more circuits are further configured to:
service the request to access the at least one memory block in response to one or more activated power rails having stabilized.

25. An apparatus, comprising:
means for determining whether a memory block operating in an active power state during a current monitoring interval has been accessed or not accessed during the current monitoring interval;
means for increasing an age associated with the memory block in response to a determination that the memory block was not accessed in the current monitoring interval;
means for determining whether the age associated with the memory block has crossed a threshold that triggers a transition to a low-leakage power state; and
means for transitioning the memory block from the active power state to the low-leakage power state in response to the age associated with the memory block crossing the threshold that triggers the transition to the low-leakage power state and one or more performance-related criteria associated with the memory block permitting the transition to the low-leakage power state, wherein data stored in the memory block is retained in the low-leakage power state, and wherein the transition comprises switching the memory block from a shared voltage rail to a low power voltage rail.

26. The apparatus recited in claim 25, further comprising means for maintaining the memory block in the active power state in response to the one or more performance-related criteria associated with the memory block pinning the memory block to the active power state regardless of whether the age associated with the memory block has crossed the threshold that triggers the transition to the low-leakage power state.

27. The apparatus recited in claim 25, further comprising means for transitioning the memory block to a power-down state in response to one or more of the age associated with the memory block crossing a threshold that triggers a transition to the power-down state or the one or more performance-related criteria associated with the memory block indicating that the data stored in the memory block does not need to be retained, wherein transitioning the memory block to the power-down state causes the memory block to consume substantially no leakage power.

28. The apparatus recited in claim 25, further comprising:
means for determining that the age associated with the memory block has crossed a threshold that triggers a transition to a power-down state; and
means for maintaining the memory block in the low-leakage power state in response to the one or more performance-related criteria associated with the memory block preventing the transition to the power-down state despite the age associated with the memory block having crossed the threshold that triggers the transition to the power-down state.

29. The apparatus recited in claim 25, further comprising:
means for transitioning the memory block from the low-leakage power state to the active power state in response to receiving a request to access the memory block subsequent to the transition to the low-leakage power state;
means for servicing the request to access the memory block in response to one or more power rails used to deliver power to the memory block in the active power state having stabilized.

30. A non-transitory computer-readable medium storing computer-executable instructions, the stored computer-executable instructions configured to cause one or more circuits to:
determine whether a memory block operating in an active power state during a current monitoring interval has been accessed or not accessed during the current monitoring interval;
increase an age associated with the memory block in response to a determination that the memory block was not accessed in the current monitoring interval;
determine whether the age associated with the memory block has crossed a threshold that triggers a transition to a low-leakage power state; and
transition the memory block from the active power state to the low-leakage power state in response to the age associated with the memory block crossing the threshold that triggers the transition to the low-leakage power state and one or more performance-related criteria associated with the memory block permitting the transition to the low-leakage power state, wherein data stored in the memory block is retained in the low-leakage power state, and wherein the transition comprises switching the memory block from a shared voltage rail to a low power voltage rail.

* * * * *